United States Patent
Lee et al.

(10) Patent No.: US 11,495,398 B2
(45) Date of Patent: Nov. 8, 2022

(54) COIL ELECTRONIC COMPONENT

(71) Applicant: SAMSUNG ELECTRO-MECHANICS CO., LTD., Suwon-Si (KR)

(72) Inventors: Young Il Lee, Suwon-si (KR); Han Wool Ryu, Suwon-si (KR); Sang Kyun Kwon, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 922 days.

(21) Appl. No.: 16/003,901

(22) Filed: Jun. 8, 2018

(65) Prior Publication Data

US 2019/0115147 A1    Apr. 18, 2019

(30) Foreign Application Priority Data

Oct. 18, 2017    (KR) .................. 10-2017-0135379

(51) Int. Cl.
| | |
|---|---|
| *H01F 27/29* | (2006.01) |
| *H01F 27/32* | (2006.01) |
| *H01F 1/147* | (2006.01) |
| *H01F 27/255* | (2006.01) |
| *H01F 17/04* | (2006.01) |

(Continued)

(52) U.S. Cl.
CPC ..... *H01F 27/324* (2013.01); *C23C 16/45555* (2013.01); *H01F 1/147* (2013.01); *H01F 1/26* (2013.01); *H01F 17/0013* (2013.01); *H01F 17/04* (2013.01); *H01F 27/255* (2013.01); *H01F 27/29* (2013.01); *H01F 27/292* (2013.01); *C23C 16/403* (2013.01); *C23C 16/45525* (2013.01);

(Continued)

(58) Field of Classification Search
CPC ............ H01F 27/255; H01F 2017/048; H01F 17/0013; H01F 17/04; H01F 27/245; H01F 27/29; H01F 27/324
USPC ................................................ 336/192, 200
See application file for complete search history.

(56) References Cited

U.S. PATENT DOCUMENTS 3,541,934 A * 11/1970 Hughes ............... E01C 19/185
                                                                    404/120
6,372,338 B1 * 4/2002 Jeffers ..................... G03C 5/14
                                                                    428/323

(Continued)

FOREIGN PATENT DOCUMENTS

| CN | 101107681 A | 1/2008 |
|---|---|---|
| CN | 101454847 A | 6/2009 |

(Continued)

OTHER PUBLICATIONS

Office Action issued in corresponding Chinese Patent Application No. 201811112983.2 dated Sep. 2, 2020, with English translation.

(Continued)

*Primary Examiner* — Elvin G Enad
*Assistant Examiner* — Joselito S. Baisa
(74) *Attorney, Agent, or Firm* — Morgan, Lewis & Bockius LLP

(57) ABSTRACT

A coil electronic component includes a body including an insulator; a coil portion embedded in the body; aggregates dispersed in the insulator, where the aggregates each comprise a plurality of magnetic particles, coating layers formed on surfaces of the aggregates using an insulating material, and external electrodes connected to the coil portion.

18 Claims, 3 Drawing Sheets

(51) Int. Cl.
   *H01F 17/00* (2006.01)
   *C23C 16/455* (2006.01)
   *H01F 1/26* (2006.01)
   *C23C 16/40* (2006.01)
   *H01F 1/33* (2006.01)
   *H01F 41/02* (2006.01)

(52) U.S. Cl.
   CPC ............ *H01F 1/33* (2013.01); *H01F 41/0246* (2013.01); *H01F 2017/048* (2013.01)

(56) References Cited

U.S. PATENT DOCUMENTS

| | | | |
|---|---|---|---|
| 6,373,368 B1* | 4/2002 | Shikama | H01F 41/04 |
| | | | 29/605 |
| 7,923,068 B2* | 4/2011 | Dickey | C23C 16/045 |
| | | | 427/248.1 |
| 8,273,407 B2* | 9/2012 | Bergendahl | H01F 10/007 |
| | | | 427/248.1 |
| 8,362,866 B2* | 1/2013 | Matsuura | H01F 41/0246 |
| | | | 336/200 |
| 9,701,935 B2* | 7/2017 | Woodside | B82Y 25/00 |
| 10,176,912 B2* | 1/2019 | Nishimura | C22C 38/34 |
| 10,544,488 B2* | 1/2020 | Tanada | C22C 33/0221 |
| 2008/0029300 A1* | 2/2008 | Harada | H01F 41/0246 |
| | | | 174/391 |
| 2008/0152897 A1 | 6/2008 | Maeda et al. | |
| 2008/0193739 A1 | 8/2008 | Dickey et al. | |
| 2009/0197782 A1 | 8/2009 | Igarashi et al. | |
| 2010/0193726 A1* | 8/2010 | Maeda | C09C 1/62 |
| | | | 252/62.54 |
| 2011/0227690 A1* | 9/2011 | Watanabe | C22C 38/00 |
| | | | 264/234 |
| 2012/0038532 A1* | 2/2012 | Yonetsu | H01Q 17/00 |
| | | | 343/787 |
| 2012/0082844 A1* | 4/2012 | Takahashi | H01F 1/33 |
| | | | 428/336 |
| 2012/0188049 A1* | 7/2012 | Matsuura | H01F 1/24 |
| | | | 336/212 |
| 2013/0228717 A1* | 9/2013 | Harada | H01F 1/26 |
| | | | 252/62.55 |
| 2013/0234819 A1 | 9/2013 | Yoo et al. | |
| 2014/0002221 A1 | 1/2014 | Shin | |
| 2014/0132383 A1 | 5/2014 | Matsuura et al. | |
| 2014/0132387 A1 | 5/2014 | Shin et al. | |
| 2015/0021512 A1* | 1/2015 | Takahashi | H01F 1/01 |
| | | | 252/62.55 |
| 2015/0028983 A1 | 1/2015 | Ryu et al. | |
| 2015/0084804 A1* | 3/2015 | Takahashi | H01Q 17/004 |
| | | | 342/1 |
| 2015/0162124 A1* | 6/2015 | Kim | H01F 41/005 |
| | | | 336/200 |
| 2016/0086700 A1* | 3/2016 | Suetsuna | H01F 1/0063 |
| | | | 252/62.56 |
| 2016/0086717 A1* | 3/2016 | Harada | C22F 1/10 |
| | | | 148/303 |
| 2016/0086728 A1* | 3/2016 | Suetsuna | H01F 1/0063 |
| | | | 148/105 |
| 2016/0229738 A1* | 8/2016 | Umemoto | C03C 3/091 |
| 2016/0276074 A1 | 9/2016 | Lee et al. | |
| 2016/0276089 A1* | 9/2016 | Inoue | H01F 41/046 |
| 2017/0117082 A1 | 4/2017 | Jeong | |
| 2017/0243689 A1 | 8/2017 | Yoon et al. | |
| 2017/0278605 A1* | 9/2017 | Lisec | G01R 33/3802 |
| 2017/0352478 A1* | 12/2017 | Hirabayashi | H01F 27/255 |
| 2018/0301270 A1 | 10/2018 | Yang et al. | |

FOREIGN PATENT DOCUMENTS

| | | | | |
|---|---|---|---|---|
| CN | 101657564 A | | 2/2010 | |
| CN | 101790765 A | | 7/2010 | |
| CN | 103310945 A | | 9/2013 | |
| CN | 103515055 A | | 1/2014 | |
| CN | 103811161 A | | 5/2014 | |
| CN | 104347228 A | | 2/2015 | |
| CN | 105448451 A | | 6/2016 | |
| CN | 105761880 A | | 7/2016 | |
| CN | 106876078 A | | 6/2017 | |
| CN | 106910602 A | | 6/2017 | |
| JP | 2007-149757 A | | 6/2007 | |
| JP | 2012077316 A | * | 4/2012 | |
| JP | 2012142554 A | * | 7/2012 | |
| JP | 2013051329 A | * | 3/2013 | ............ H01F 1/01 |
| JP | 5229095 B2 | | 7/2013 | |
| JP | 2014086624 A | * | 5/2014 | |
| JP | 2014120678 A | * | 6/2014 | |
| JP | 2014207288 A | * | 10/2014 | |
| JP | 2017011042 A | * | 1/2017 | |
| KR | 10-2004-0097676 A | | 11/2004 | |
| KR | 10-2013-0126737 A | | 11/2013 | |
| KR | 10-2016-0112480 A | | 9/2016 | |
| KR | 10-2017-0048724 A | | 5/2017 | |
| WO | WO-2005024859 A1 | * | 3/2005 | ............ B22F 1/02 |

OTHER PUBLICATIONS

Korean Office Action dated Nov. 15, 2018 issued in Korean Patent Application No. 10-2017-0135379 (with English translation).
Second Office Action issued in corresponding Korean Patent Application No. 201811112983.2 dated Apr. 27, 2021, with English translation.
Liping Feng et al., "Thin Film Technology and Application", Northwestern Polytechnical University Press, pp. 185-188, Feb. 2016, and its English translation.
Chinese Office Action dated Dec. 3, 2021, issued in corresponding Chinese Patent Application No. 201811112983.2.

* cited by examiner

COIL ELECTRONIC COMPONENT

CROSS-REFERENCE TO RELATED APPLICATION(S)

This application claims the benefit of priority to Korean Patent Application No. 10-2017-0135379 filed on Oct. 18, 2017 in the Korean Intellectual Property Office, the disclosure of which is incorporated herein by reference in its entirety.

BACKGROUND

1. Field

The present disclosure relates to a coil electronic component.

2. Description of Related Art

In accordance with miniaturization and thinning of electronic devices such as a digital television (TV), a mobile phone, a laptop computer, and the like, there has been increased demand for the miniaturization and thinning of coil electronic components used in such electronic devices. In order to satisfy such a demand, research and development into various winding type or thin film type coil electronic components have been actively conducted.

A main issue regarding the miniaturization and the thinning of the coil electronic component is to maintain characteristics of an existing coil electronic component in spite of the miniaturization and the thinness. In order to maintain such characteristics, a ratio of a magnetic material should be increased in a core in which the magnetic material is filled. However, there is a limitation in increasing the ratio due to a change in strength of a body of an inductor, frequency characteristics depending on an insulation property of the body, and the like.

As an example of a method of manufacturing the coil electronic component, a method of implementing the body by stacking and then pressing sheets in which magnetic particles, a resin, and the like, are mixed with each other on coils has been used, and ferrite, a metal, or the like, may be used as the magnetic particles. When metal magnetic particles are used, it is advantageous in terms of characteristics such as a magnetic permeability, or the like, of the coil electronic component to increase a content of the metal magnetic particles. However, in this case, an insulation property of the body is deteriorated, such that breakdown voltage characteristics of the coil electronic component may be deteriorated.

SUMMARY

An aspect of the present disclosure may provide a coil electronic component of which electrical and magnetic characteristics may be improved by improving electrical insulation between a body and coil patterns.

According to an aspect of the present disclosure, a coil electronic component includes: a body including an insulator; a coil portion embedded in the body; aggregates dispersed in the insulator, where the aggregates each comprise a plurality of magnetic particles; coating layers formed on surfaces of the aggregates using an insulating material; and external electrodes connected to the coil portion.

According to another aspect of the present disclosure, a coil component includes: a body having a coil part embedded therein; and an external electrode connected to the coil part. The body contains a plurality of magnetic particles in an insulator, and the plurality of magnetic particles are coated with an insulating material.

The aggregate may have a porous structure.

The coating layer may be an atomic layer deposition (ALD) layer.

The coating layer may have a thickness of 1 µm or less.

The coating layer may be formed of alumina.

The insulator and the coating layer may be formed of different materials.

The insulator may be formed of an insulating resin, and the coating layer may be formed of ceramic.

The insulator and the coating layer may be formed of different ceramic materials.

The insulator and the coating layer may be formed in an integral structure using the same material.

The insulator and the coating layer may be formed of alumina.

The magnetic particle may have conductivity.

The magnetic particle may be formed of an Fe-based alloy.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Electronic Device

Figure 1:
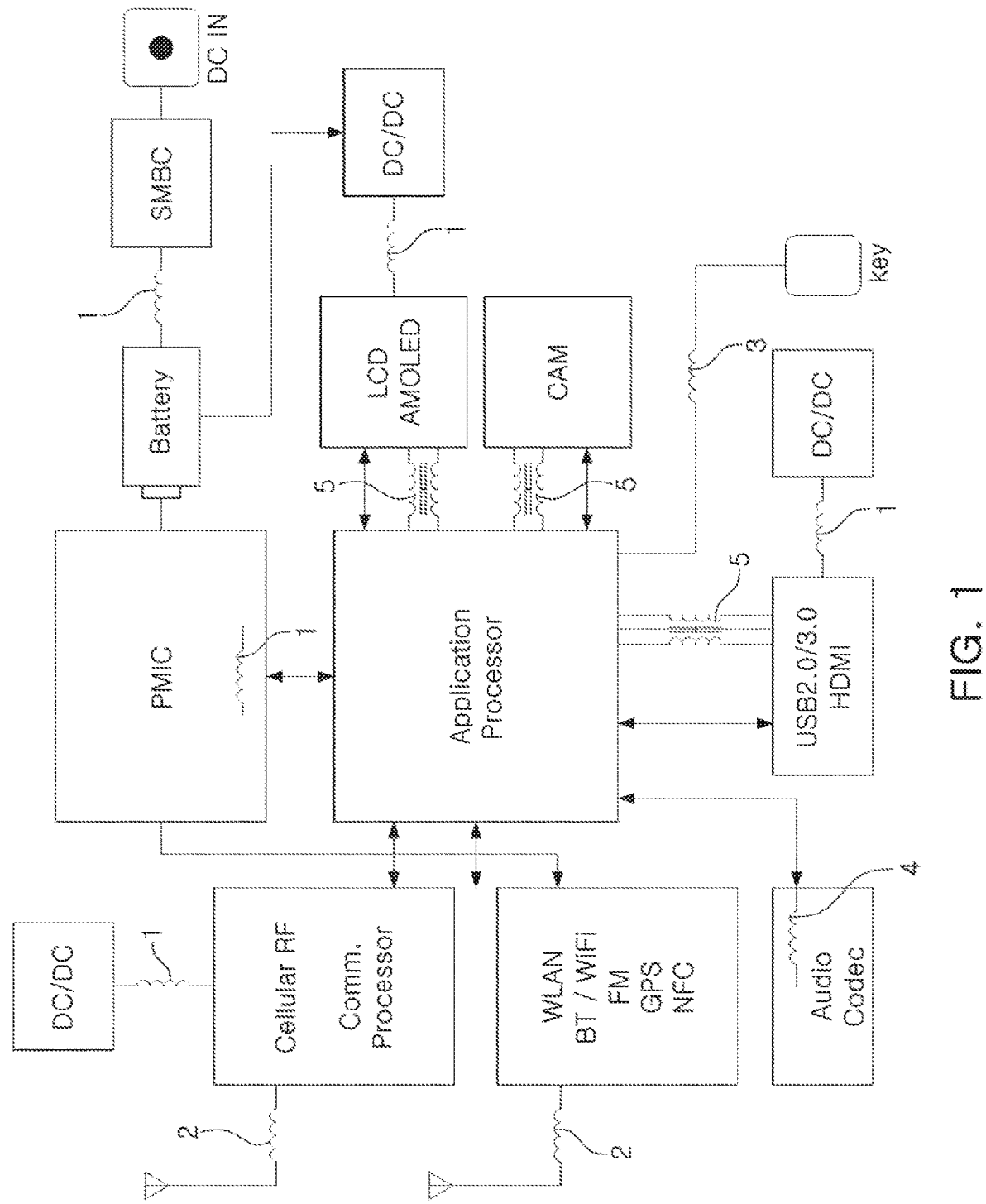
FIG. 1 is a schematic view illustrating an electronic device including an example of a coil electronic component.

FIG. 1 is a schematic view illustrating an example of an electronic device using a coil electronic component.

Referring to FIG. 1, it may be appreciated that various kinds of electronic components are used in an electronic device. For example, an application processor, a direct current (DC) to DC converter, a communications processor, a wireless local area network Bluetooth (WLAN BT)/wireless fidelity frequency modulation global positioning system near field communications (WiFi FM GPS NFC), a power management integrated circuit (PMIC), a battery, a SMBC, a liquid crystal display active matrix organic light emitting diode (LCD AMOLED), an audio codec, a universal serial bus (USB) 2.0/3.0 a high definition multimedia interface (HDMI), a CAM, and the like, may be used. In this case, various kinds of coil electronic components may be appropriately used between these electronic components depending on their purposes in order to remove noise, or the like. For example, a power inductor 1, high frequency (HF) inductors 2, a general bead 3, a bead 4 for a high frequency (GHz), common mode filters 5, and the like, may be used.

In detail, the power inductor 1 may be used to store electricity in a magnetic field form to maintain an output voltage, thereby stabilizing power. In addition, the high frequency (HF) inductor 2 may be used to perform impedance matching to secure a required frequency or cut off noise and an alternating current (AC) component. Further, the general bead 3 may be used to remove noise of power and signal lines or remove a high frequency ripple. Further, the bead 4 for a high frequency (GHz) may be used to remove high frequency noise of a signal line and a power line related to an audio. Further, the common mode filter 5 may be used to pass a current therethrough in a differential mode and remove only common mode noise.

An electronic device may be typically a smartphone, but is not limited thereto. The electronic device may also be, for example, a personal digital assistant, a digital video camera, a digital still camera, a network system, a computer, a monitor, a television, a video game, a smartwatch, or the like. The electronic device may also be various other electronic devices well-known in those skilled in the art, in addition to the devices described above.

Coil Electronic Component

Hereinafter, a coil electronic component according to the present disclosure, particularly, an inductor will be described for convenience of explanation. However, the coil electronic component according to the present disclosure may also be used as the coil electronic components for various purposes as described above.

Figure 2:
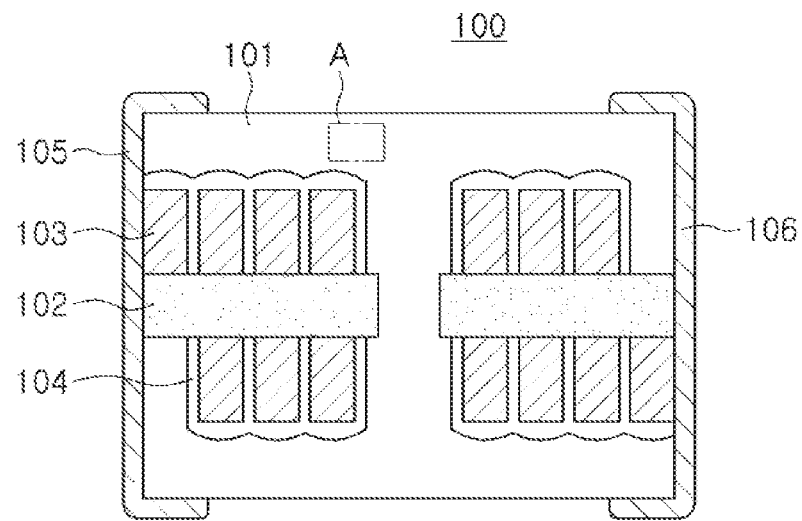
FIG. 2 is a schematic cross-sectional view illustrating a coil electronic component according to an exemplary embodiment in the present disclosure.
Figure 3:
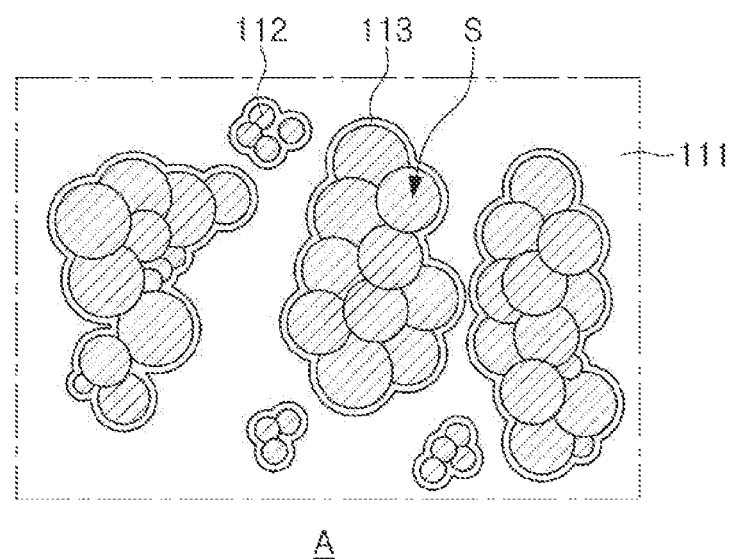
FIG. 3 is an enlarged view of region A of FIG. 2.
Figure 4:
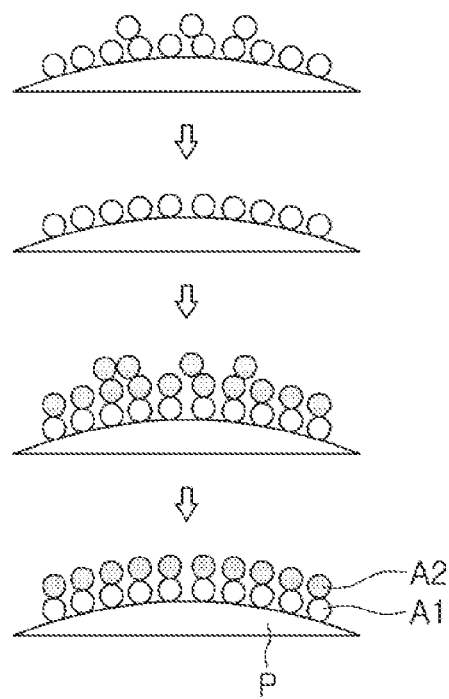
FIG. 4 is a view illustrating a principle that a thin film is formed by atomic layer deposition (ALD)

FIG. 2 is a schematic cross-sectional view illustrating a coil electronic component according to an exemplary embodiment in the present disclosure. FIG. 3 is an enlarged view of region A of FIG. 2. FIG. 4 is a view illustrating a principle that a thin film is formed by atomic layer deposition (ALD).

A coil electronic component 100 according to an exemplary embodiment in the present disclosure may include a body 101, a coil portion 103, and external electrodes 105 and 106 as main components, and may include an insulating layer 104 formed on a surface of the coil portion 103 in order to insulate the coil portion 103. The coil portion 103 may be embedded in the body 101. In this case, a support member 102 supporting the coil portion 103 may be disposed in the body 101.

The coil portion 103 may function in various capacities within the electronic device. For example, the coil electronic component 100 may be a power inductor. In this case, the coil portion 103 may serve to store electricity in a magnetic field form to maintain an output voltage, resulting in stabilization of power. In this case, coil patterns constituting the coil portion 103 may be stacked on opposite surfaces of the support member 102, respectively, and may be electrically connected to each other through a conductive via penetrating through the support member 102. The coil portion 103 may have a spiral shape, and include lead portions formed at the outermost portions of the spiral shape. The lead portions may be exposed to the outside of the body 101 for the purpose of electrical connection to the external electrodes 105 and 106.

The coil patterns constituting the coil portion 103 may be formed by a plating process used in the related art, such as a pattern plating process, an anisotropic plating process, an isotropic plating process, or the like, and may also be formed in a multilayer structure by a plurality of processes of these processes.

The support member 102 supporting the coil portion 103 may be formed of a polypropylene glycol (PPG) substrate, a ferrite substrate, a metal based soft magnetic substrate, or the like. In addition, the insulating layer 104 formed on the surface of the coil portion 103 may be used in order to electrically separate the coil portion 103 from magnetic particles 112 disposed in the body 101 and may be formed of an oxide film, a polymer material, or the like, and an ALD layer may also be used.

The external electrodes 105 and 106 may be formed on outer surfaces of the body 101, and may be connected to the coil portion 103, more specifically, the lead portions of the coil portion 103. The external electrodes 105 and 106 may be formed of a paste including a metal having excellent electrical conductivity, such as a conductive paste including nickel (Ni), copper (Cu), tin (Sn), or silver (Ag), or alloys thereof. In addition, plating layers (not illustrated) may further be formed on the external electrodes 105 and 106. In this case, the plating layers may include one or more selected from the group consisting of nickel (Ni), copper (Cu), and tin (Sn). For example, nickel (Ni) layers and tin (Sn) layers may be sequentially formed in the plating layers.

As illustrated in FIG. 3, in the present exemplary embodiment, the body 101 may include an insulator 111 and a plurality of magnetic particles 112 dispersed in a form of aggregates S in the insulator 111. In addition, coating layers 113 may be formed on surfaces of the aggregates S using an insulating material. As the insulator 111, an insulating resin such as an epoxy resin may be used. In addition to the resin, another material may be used as a material of the insulator 111. For example, the insulator 111 may be formed of ceramic such as alumina, silica, or the like.

The magnetic particles 112 may be formed of a conductive material having a magnetic property. An example of such a material may include an Fe-based alloy. In detail, the magnetic particles 112 may be formed of a nano crystal grain based alloy of having an Fe—Si—B—Nb—Cr composition, an Fe—Ni-based alloy, or the like. When the magnetic particles 112 are implemented using the Fe-based alloy as described above, magnetic characteristics of the body 101, such as a magnetic permeability, and the like, may be excellent, but the body 101 may be vulnerable to electrostatic discharge (ESD), and an appropriate insulating structure may thus be required between the magnetic particles 112 and between the magnetic particles 112 and the coil portion 103. That is, when an insulation property of the magnetic particles 112 is deteriorated, breakdown voltage characteristics of the coil electronic component may be deteriorated, such that an electrical conduction path between the magnetic particles 112 or between the magnetic particles 112 and the coil portion 103 may be formed, resulting in deterioration of characteristics such as a decrease in an inductance of the inductor, or the like.

In the present exemplary embodiment, as illustrated in FIG. 3, the magnetic particles 112 may be implemented in the form of the aggregates S, and the insulating coating layers 113 may be formed on the surfaces of the aggregates S to effectively insulate the magnetic particles 112. The aggregate S obtained by aggregating a plurality of particles may have a porous structure, and may be formed by weakly sintering the magnetic particles 112 or inducing generation of necking between the magnetic particles 112 using a small amount of binder component.

The insulating coating layer 113 covering the surface of the aggregate S may be an atomic layer deposition (ALD) layer to provide an effective insulating structure of the magnetic particles 112. As illustrated in FIG. 4, ALD may be a process capable of performing very uniform coating on a surface of a target object P at a level of atomic layers A1 and A2 by a surface chemical reaction in a process of periodically supplying and discharging a reactant, and the ALD layer obtained by the ALD may have a small thickness and have an excellent insulation property. In addition, the ALD layer may have excellent thickness uniformity, and may be improved in terms of heat resistance and thermal expansion characteristics. The ALD process may be used to effectively form the coating layer 113 in fine cavities of the aggregate S and provide a uniform insulation property of the entire body 101. In this case, the coating layer 113 formed by the ALD may be formed of ceramic such as alumina ($Al_2O_3$), silica ($SiO_2$), or the like. A thickness of the coating layer 113 may be about fpm or less, more preferably, 100 nm or less.

The coating layer 113 and the insulator 111 may be formed of different materials. As an example, as described above, the insulator 111 may be formed of the insulating resin, and the coating layer 113 may be formed of the ceramic. In addition, the insulator 111 and the coating layer 113 may be formed of different ceramic materials. In this case, the coating layer 113 may be formed by the ALD process, and the insulator 111 may be formed of another process such as chemical vapor deposition, or the like, as well as the ALD process. When both of the insulator 111 and the coating layer 113 are formed of the ceramic, magnetic characteristics of the body 101 may be improved due to an increase in magnetic materials.

Figure 5:
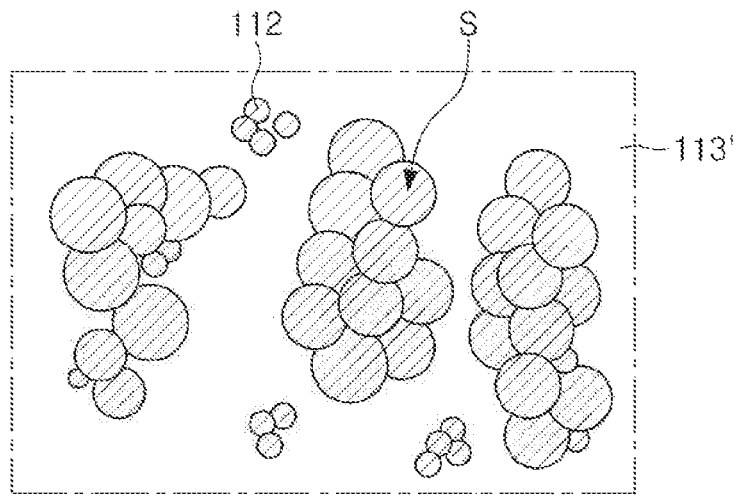
FIG. 5 is a schematic cross-sectional view illustrating a region of a body in a coil electronic component according to another exemplary embodiment.

Meanwhile, as in a modified example of FIG. 5, the insulator and the coating layer may be formed in an integral structure using the same material, and the insulator and the coating layer have the integral structure, and may thus be collectively called a coating layer 113'. The insulator and the coating layer 113' having the integral structure may be formed of ceramic such as alumina, or the like. In this case, the insulator and the coating layer 113' may be formed by the same process or may be obtained by different processes. The coating layer 113' may be formed by the ALD process, and the insulator 111 may be formed by another process such as chemical vapor deposition, or the like, as well as the ALD process. In detail, the coating layer coating the surface of the aggregate S may be formed by the ALD process, and an insulator region covering the coating layer may be formed by the process such as the chemical vapor deposition, or the like, in consideration of the fact that the insulator region has a relatively large volume.

As set forth above, in the coil electronic component according to the exemplary embodiment in the present disclosure, an electrical insulation property between the body and the coil patterns may be improved, such that electrical and magnetic characteristics of the coil electronic component may be improved.

While exemplary embodiments have been shown and described above, it will be apparent to those skilled in the art that modifications and variations could be made without departing from the scope of the present invention as defined by the appended claims.

What is claimed is:

1. A coil electronic component comprising:
   a body including an insulator;
   a coil portion embedded in the body;
   aggregates dispersed in the insulator, where the aggregates each comprise a plurality of magnetic particles contacting each other;
   coating layers formed on respective surfaces of the aggregates such that at least two of adjacent coating layers are spaced apart from each other; and
   external electrodes connected to the coil portion, wherein at least one of the coating layers is an atomic layer deposition (ALD) layer.

2. The coil electronic component of claim 1, wherein at least one of the aggregates has a porous structure.

3. The coil electronic component of claim 1, wherein at least one of the coating layers has a thickness of 1 µm or less.

4. The coil electronic component of claim 1, wherein at least one of the coating layers is formed of alumina.

5. The coil electronic component of claim 1, wherein the insulator and at least one of the coating layers are formed of different materials.

6. The coil electronic component of claim 5, wherein the insulator includes an insulating resin, and at least one of the coating layers is formed of ceramic.

7. The coil electronic component of claim 5, wherein the insulator and at least one of the coating layers are formed of different ceramic materials.

8. The coil electronic component of claim 1, wherein the insulator and at least one of the coating layers are formed in an integral structure using the same material.

9. The coil electronic component of claim 8, wherein the insulator and at least one of the coating layers are formed of alumina.

10. The coil electronic component of claim 1, wherein the magnetic particles are electrically conductive.

11. The coil electronic component of claim 10, wherein the magnetic particles comprise an Fe-based alloy.

12. The coil electronic component of claim 1, wherein at least one of the coating layers is formed of an insulating material.

13. A coil component comprising:
    a body having a coil part embedded therein; and
    an external electrode connected to the coil part,
    wherein the body contains a plurality of magnetic particles in an insulator,
    at least two of the plurality of magnetic particles contact each other, and
    the at least two of the plurality of magnetic particles and another one or more of the plurality of magnetic particles are respectively coated with insulating materials such that at least two of adjacent insulating materials are spaced apart from each other, and at least one of the insulating materials is an atomic layer deposition (ALD) layer.

14. The coil component of claim 13, wherein at least a portion of the plurality of magnetic particles form an aggregate.

15. The coil component of claim 13, wherein at least one of the insulating materials has a thickness of 1 µm or less.

16. The coil component of claim 13, wherein at least one of the insulating materials is formed of alumina.

17. The coil component of claim 14, wherein the aggregate has a porous structure.

18. The coil component of claim 13, wherein the insulator and at least one of the insulating materials are formed in an integral structure using the same material.

* * * * *